(12) United States Patent
Bastani et al.

(10) Patent No.: US 12,353,967 B2
(45) Date of Patent: Jul. 8, 2025

(54) METHOD AND APPARATUS FOR DETERMINING FEATURE CONTRIBUTION TO PERFORMANCE

(71) Applicant: ASML NETHERLANDS B.V., Veldhoven (NL)

(72) Inventors: Vahid Bastani, Eindhoven (NL); Dag Sonntag, Eindhoven (NL); Reza Sahraeian, Eindhoven (NL); Dimitra Gkorou, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 858 days.

(21) Appl. No.: 17/624,014

(22) PCT Filed: Jun. 5, 2020

(86) PCT No.: PCT/EP2020/065619
§ 371 (c)(1),
(2) Date: Dec. 30, 2021

(87) PCT Pub. No.: WO2021/001114
PCT Pub. Date: Jan. 7, 2021

(65) Prior Publication Data
US 2022/0351075 A1 Nov. 3, 2022

(30) Foreign Application Priority Data

Jul. 4, 2019 (EP) .................................. 19184423
Jul. 17, 2019 (EP) .................................. 19186833

(51) Int. Cl.
*G03F 7/00* (2006.01)
*G06N 20/00* (2019.01)
*H01L 21/66* (2006.01)

(52) U.S. Cl.
CPC ............. *G06N 20/00* (2019.01); *G03F 7/705* (2013.01); *G03F 7/70616* (2013.01)

(58) Field of Classification Search
CPC ..... G06N 20/00; G03F 7/705; G03F 7/70616; G03F 7/70525; G03F 7/70625;
(Continued)

(56) References Cited

U.S. PATENT DOCUMENTS 6,952,253 B2   10/2005   Lof et al.
10,417,359 B2   9/2019   Socha et al.
(Continued)

FOREIGN PATENT DOCUMENTS

CN   108369387   8/2018
EP   3312672    4/2018
(Continued)

OTHER PUBLICATIONS

Office Action issued in corresponding Chinese Patent Application No. 202080045171 X, dated Feb. 9, 2024.
(Continued)

*Primary Examiner* — Nghia M Doan
(74) *Attorney, Agent, or Firm* — Pillsbury Winthrop Shaw Pittman, LLP

(57) ABSTRACT

A method of determining a contribution of a process feature to the performance of a process of patterning substrates. The method may include obtaining a first model trained on first process data and first performance data. One or more substrates may be identified based on a quality of prediction of the first model when applied to process data associated with the one or more substrates. A second model may be trained on second process data and second performance data associated with the identified one or more substrates. The second model may be used to determine the contribution of a
(Continued)

process feature of the second process data to the second performance data associated with the one or more substrates.

20 Claims, 6 Drawing Sheets

(58) Field of Classification Search
CPC ........... G03F 7/70633; G03F 7/706837; G05B 2219/32194; G05B 19/41875; Y02P 90/02; H01L 22/12; H01L 22/20
See application file for complete search history.

(56) References Cited

U.S. PATENT DOCUMENTS

| | | | |
|---|---|---|---|
| 2018/0111335 A1* | 4/2018 | Mummidi | B29C 64/386 |
| 2019/0187569 A1 | 6/2019 | Ypma et al. | |
| 2019/0271919 A1* | 9/2019 | Harutyunyan | G03F 7/70525 |
| 2020/0356011 A1 | 11/2020 | Su et al. | |

FOREIGN PATENT DOCUMENTS

| | | |
|---|---|---|
| EP | 3352013 | 7/2018 |
| TW | 201921151 | 6/2019 |
| WO | 2018202361 | 11/2018 |
| WO | 2018233966 | 12/2018 |

OTHER PUBLICATIONS

International Search Report and Written Opinion issued in corresponding PCT Patent Application No. PCT/EP2020/065619, dated Aug. 19, 2020.

Taiwanese Office Action issued in corresponding Taiwanese Patent Application No. 109120733, dated Jun. 15, 2021.

* cited by examiner

METHOD AND APPARATUS FOR DETERMINING FEATURE CONTRIBUTION TO PERFORMANCE

CROSS-REFERENCE TO RELATED APPLICATIONS

This application is the U.S. national phase entry of PCT Patent Application No. PCT/EP2020/065619 which was filed on Jun. 5, 2020, which claims the benefit of priority of European Patent Application No. 19184423.2 which was filed on Jul. 4, 2019 and of European Patent Application No. 19186833.0 which was filed on Jul. 17, 2019, each of which is incorporated herein in its entirety by reference.

FIELD

The present invention relates to methods and apparatus for analysing patterning processes. Specifically, it relates to the determination of a contribution of a process feature to the performance of the process.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

When the difficulties in lithographic patterning described above are not addressed, this may lead to a reduction in the quality of the patterning process. If the quality of a patterning process drops, this may result in a reduction in the quality of the final patterned substrate. Therefore, assessing the quality of a patterned substrate may give an indication of the patterning process quality. In order to test the quality of the patterned substrate, it may be tested whether the patterned substrate functions or not. The patterned substrate may comprise a plurality of elements (e.g., dies) which may be tested individually to determine whether the element passes, that is to say the element works, or whether it has failed (does not work). The proportion of elements on a substrate that work may be referred to as the yield of the substrate. It is desirable to improve the yield of a lithographic apparatus and corresponding patterning processes to obtain more working elements on a substrate.

SUMMARY

According to a first aspect of the disclosure, there is provided a method of determining the contribution of a process feature to the performance of a process of patterning substrates. The method comprises obtaining a first model trained on first process data and first performance data. One or more substrates may be identified based on a quality of prediction of the first model when applied to process data associated with the one or more substrates. A second model may be trained on second process data and second performance data associated with the identified one or more substrates, and the second model may be used to determine the contribution of a process feature of the second process data to the second performance data associated with the one or more substrates.

Optionally, identifying one or more substrates may comprise providing process data associated with a plurality of substrates as input to the first model, and obtaining predicted performance data as an output of the first model.

Optionally the method may further comprise obtaining measured performance data for the plurality of substrates.

Optionally, identifying one or more substrates may further comprise comparing the predicted performance data to the measured performance data to determine the quality of prediction.

Optionally, the predicted performance data may comprise predicted yield data.

Optionally, the first model may comprise a neural network.

Optionally, the output of the first model may further comprise an estimate of the contribution of a plurality of process features of the process data associated with the plurality of substrates to the predicted performance data.

Optionally, the output of the first model may comprise a ranking of the estimated contribution of the plurality of process features to the predicted performance data.

Optionally, the plurality of process features may include one or more of overlay, alignment, levelling, critical dimension, thickness, and context data.

Optionally, the process data may comprise data in relation to a plurality of layers of a substrate.

Optionally, the method may further comprise generating augmented process data based on the one or more identified substrates.

Optionally, the second process data may comprise the augmented process data and the process data of the one or more identified substrates.

Optionally, generating augmented process data may comprise modelling a parametric distribution for a process feature, and generating a plurality of samples according to the modelled parametric distribution, wherein the augmented process data comprises the plurality of samples.

Optionally, generating augmented process data may comprise determining a range of values for a process feature, and generating a plurality of samples within the range of values for the process feature, wherein the augmented process data comprises the plurality of samples.

Optionally, the method may further comprise providing the augmented process data as input to the first model, and obtaining augmented predicted performance data as an output of the first model.

Optionally, the second performance data may comprise the augmented predicted performance data and the predicted performance data for the one or more substrates.

Optionally, the second model may be an interpretable model.

Optionally, the interpretable model may comprise one or more of a linear model, a shallow decision tree, a random forest, or a gradient boosting tree.

Optionally, using the second model to determine a contribution of a process feature of the second process data to the second performance data associated with the identified one or more substrates may comprise training the second model on the second process data and the second performance data, using the second model to estimate a relation between a process feature and second performance data, and determining the contribution of a process feature based on the estimated relation.

Optionally, a substrate may be identified if the quality of prediction is above a predetermined threshold.

Optionally, a substrate may be identified if the quality of prediction is above a predetermined loss metric.

Optionally, the first model may be a global model representing a set of substrates. The second model may be a local model representing a selected subset of the set of substrates.

Optionally, the method may further comprise diagnosing a performance issue of an apparatus for performing the process of patterning substrates based on the determined contribution of the process feature.

Optionally, the method may further comprise updating one or more process settings based on the determined contribution of the process feature, and providing the updated one or more process settings to an apparatus performing the process of patterning substrates.

According to another aspect of the disclosure there is provided a computer program comprising instructions which, when executed on at least one processor, cause the at least one processor to carry out a method as described above.

According to another aspect of the disclosure there is provided a processor-readable medium comprising instructions which, when executed by a processor, cause the processor to perform a method as described above.

According to another aspect of the disclosure there is provided an apparatus for determining the contribution of a process feature to the performance of a process of patterning substrates. The apparatus comprises one or more processors configured to execute compute program code to undertake the method as set out above.

According to another aspect of the current disclosure there is provided a metrology apparatus comprising an apparatus as described above.

According to another aspect of the current disclosure there is provided an inspection apparatus comprising an apparatus as described above.

According to another aspect of the current disclosure there is provided a lithographic apparatus comprising an apparatus as described above.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
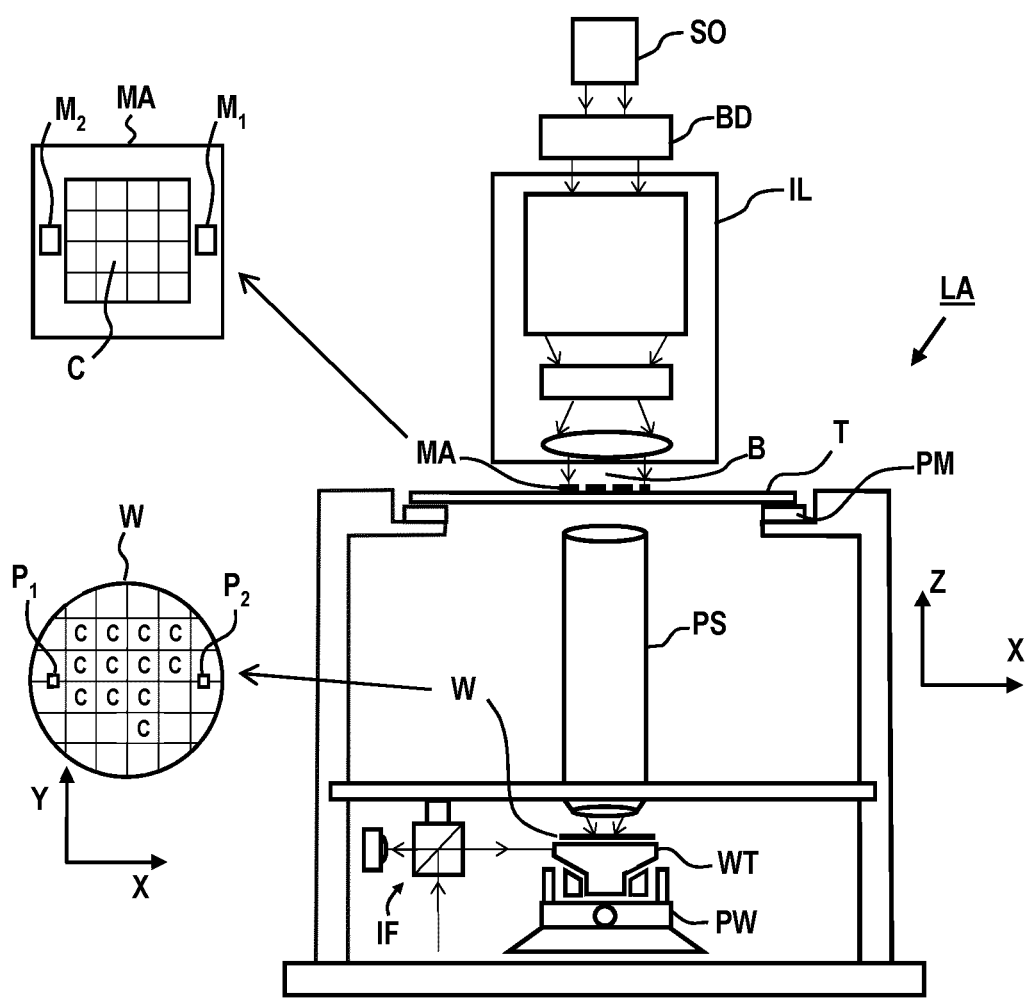
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) T constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W— which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support T, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
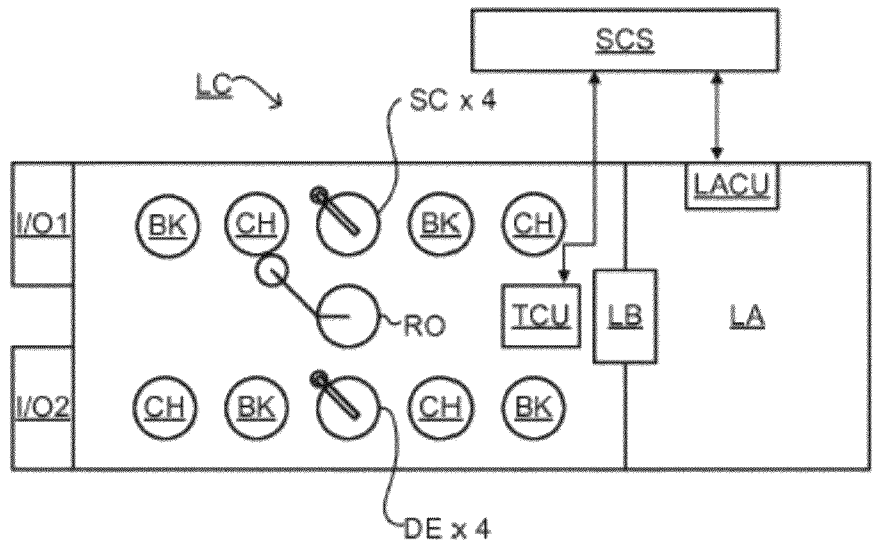
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
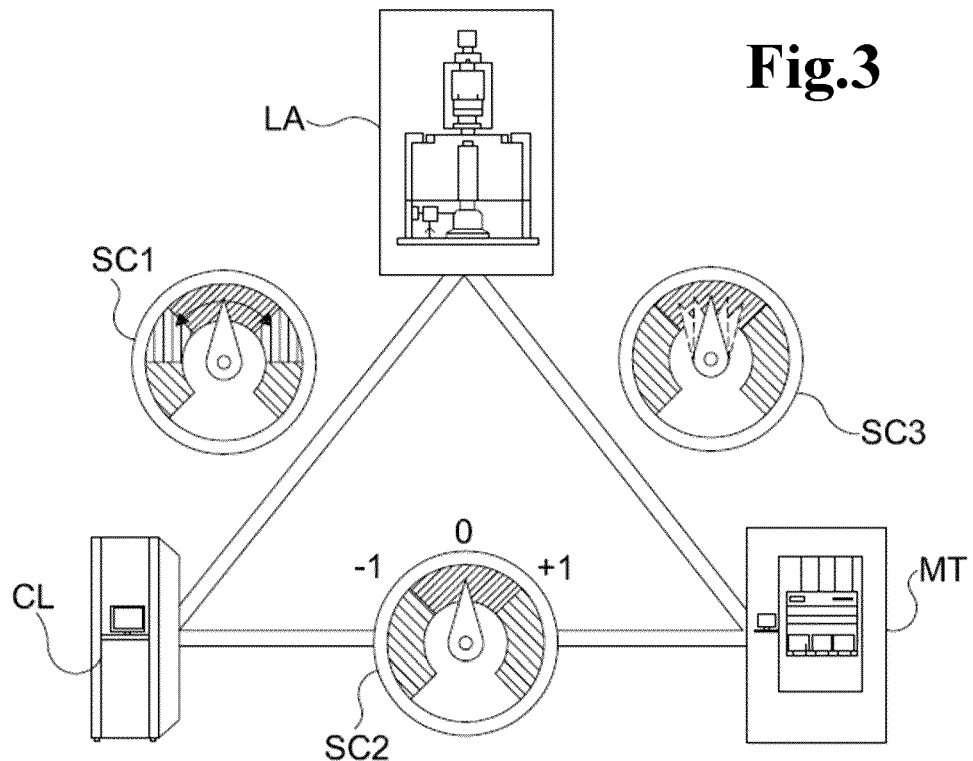
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

Metrology tools MT may be used to measure one or more features or properties relating to a lithographic substrate. One type of property which may be of interest may be the performance of the patterning process. The performance of the patterning process may be difficult to measure directly. Instead the performance may be assessed indirectly, by measuring properties associated with the performance. This may, for example, include an assessment of the quality of the final pattern present on the substrate. One way to evaluate the quality of the final pattern is by measuring the yield of the substrate. Other example methods of assessing patterning performance include repair density, probe bin codes, etc. The yield of a substrate may represent the proportion of elements on a substrate which function adequately. Assessing yield may comprise making a determination for each individual element on a substrate, whether it "works" or "fails". Working elements may be said to pass the yield test. The number of working elements divided to the total number of elements may be the yield of a substrate. An element may be an entity configured to be able function separately from other entities on the substrate. This element may be referred to as a die. Examples of elements may be a memory cell, a switch, a processing unit, etc.

Measuring yield may give an indication of the quality of the patterned substrate. A perfectly patterned substrate, where each die comprises a functioning element, has a yield of 100%. A substrate where all of the dies consist of non-working elements has a yield of 0%. Obtaining a yield of 100%, or as close to 100% as possible, is a target for high quality lithographic patterning. In order to diagnose any issues and determine how to improve patterning to increase yield, it may be desirable to determine a root cause, or to determine one or more potential root causes, for failed dies on a substrate. A root cause for yield loss may also be referred to as a root cause of yield for brevity. Example causes of yield loss may include problems with alignment, overlay, or levelling of one or more layers of the substrate, or with an etching step on the substrate (e.g. etching too much or not enough).

Known yield root cause finding methods may use data from many sample substrates to establish a correlation model. For example, a correlation model may comprise a multivariate machine learning model or univariate linear/ non-linear correlation analysis. In case of a machine learning correlation model, feature weights may be used as an indicator of the importance of that feature as a potential root cause. Features may be ranked in the order of their correlation to a yield loss. This ranking may be used to select one or more potential yield root causes.

A problem with using known correlation models is that the relationship between substrate yield, patterning process properties, and measured process features is complex. As used herein, the term "process feature" (or simply "feature") refers to a property, parameter or feature related to a lithographic patterning process. A correlation model may attempt to find process features in data from sample substrates that explain the yield loss, by attempting to find correlations. However, if there are many substrates, many different correlations exist between the features and the yield. For example, a substrate may comprise many different manufacturing layers to form a final patterned substrate with one or more finished dies. Different process features may affect the yield in different manufacturing layers and/or in different substrates. For example, in one layer, an issue with overlay may cause a yield loss in one region of the substrate. In another layer, a problem with critical dimension variation may cause yield loss in another region of the substrate. Correlation models generally take an average of all provided yield loss data, and use this average for trying to find a potential root cause. However, the correlation model may not be able to accurately differentiate between two or more individual causes for yield loss. This may lead to incorrect predictions of root causes.

The present disclosure relates to a method and apparatus for determining one or more potential root causes for yield loss on one or more substrates. Alternatively, root causes for loss in another indicator of patterning process performance may be determined. The method may determine potential root causes by making an estimation of yield loss based on process data, and make an estimation of which features of the process data most affect the loss in yield. These features may be linked to a potential root cause of the yield loss. The process data may comprise metrology data obtained for one or more substrates. Process data may also comprise manufacturing process data related to lithographic patterning and/or other manufacturing processes for the substrates. The metrology data and/or process data provided to the method may relate to process features. The method may also use yield data obtained for the one or more substrates. Examples of process features may include metrology data such as overlay, levelling, alignment, critical dimension, or lithographic apparatus settings, recipe settings for patterning steps, context data, etc. The method described herein uses two models, in order to distinguish between the contributions of different process features to the yield of one or more substrates. Based on the different contributions made by different process features to the yield loss, potential root causes for yield loss may be identified.

Figure 4:
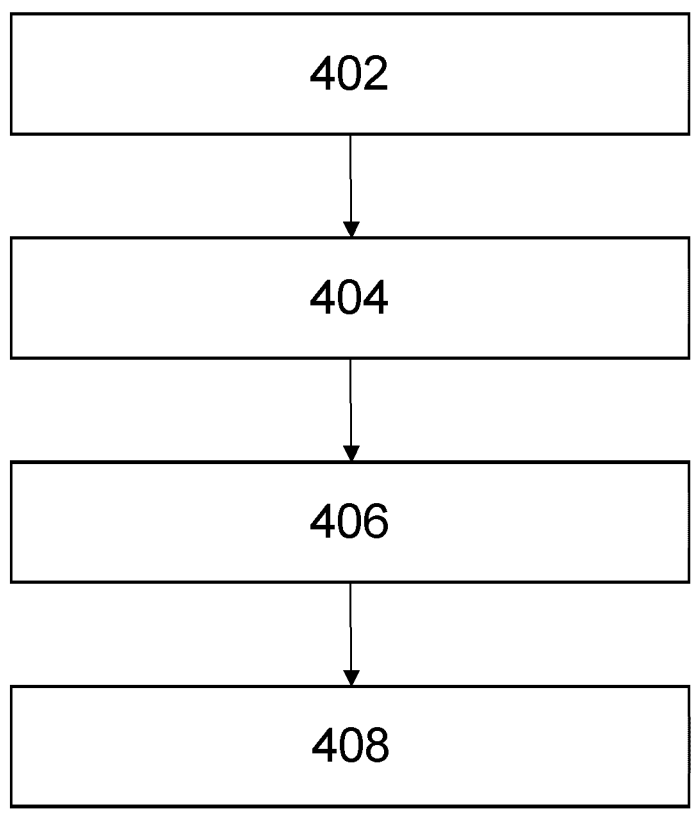
FIG. 4 depicts a flow diagram of steps in a method of determining the contribution of a process feature to the performance of a pattering process.

FIG. 4 depicts a flow diagram of a method of determine the contribution of a process feature to the performance of a process of patterning substrates. At 402, a first model is obtained. For example, a previously-generated model may be retrieved from storage (e.g., from a data storage device), or the first model may be generated anew. The first model may be trained on first process data and first performance data. The first process data and first performance data may comprise historical data. Historical data may relate to earlier runs of the patterning processes for which performance is analysed in the method. Process data may comprise a plurality of data points for one or more process features.

Process features may relate to properties of a substrate, for example overlay, alignment, critical dimension, levelling, etc. For example, process data may comprise a distribution of measurements across a substrate for one or more process features. Performance data may relate to a property related to the substrate on which the performance of the substrate is being assessed. An example of performance data may be yield data of a substrate. As described herein, a first model may receive process data as input, and provide an estimation of performance data as output. As part of the training process, the estimated performance data may be assessed against provided (known) first performance data, in order to train the model.

At 404, one or more substrates may be identified. The identification may be based on a quality of prediction of the first model when applied to the process data of the one or more substrates. The first model may have been applied to a set of substrates for making the prediction. The one or more substrates may be a subset of the set of substrates. At 406, a second model may be trained on second process data and second performance data. The second process data and second performance data may be associated with the one or more substrates. At 408, the trained second model may be used to determine a contribution of a feature of the second process data to the second performance data associated with the one or more substrates.

The first model may be a global model representing a population of substrates. The first model will be referred to as a global model for the rest of the description. The first process data and first performance data may be referred to as global process data and global performance data, respectively. The global process data and global performance data may comprise data relating to a large number of substrates. Therefore, the global model may be trained on a large number of substrates. As a result, the global model may have been trained on process data representing many different process features creating many different effects on the performance of the patterning process. The global model may be used to predict a performance of the patterning process for a set of substrates. The set of substrates may for example be a lot of substrates. A lot may be a group of substrates that go through the same patterning process. As a result, they may have similar and comparable properties, making them suitable to be analysed together. A lot of substrates may, for example, comprise twenty-five substrates.

The global model GM may be a machine learning model. Specifically, the global model GM may be a neural network, for example a deep neural network. The global model may possess one or more properties of models described in WO2018/202361, which is incorporated herein by reference.

When the global model is trained on process data from a large set of training substrates, multiple causes for die failure/yield loss may be present on multiple different training substrates. Some causes may not be present in some of the training substrates. When the model determines a correspondence between the process data and the yield prediction, the effects of causes not present across all/most of the training substrates may be underestimated. The less prevalent causes may thus be obscured by averaging effects over the large set of training substrates. As a result, a global model trained on a large set of substrates may not be suitable for determining the contribution of process features as causes for die failure and yield loss. In other words, the global model may be unable to determine which process feature(s) was the root cause(s) for failure of a specific die, wafer or lot.

In order to allow the root cause(s) of yield loss to be determined, the method disclosed herein uses a second model. The second model may be a local model representing a subset selected from the set of substrates. The second model will be referred to as a local model for the rest of the description. The second process data and second performance data may also be referred to as local process data and local performance data, respectively. A function of the local model may be to interpret the behavior of the global model in the vicinity (or locality) of the subset of substrates. An advantage of training a local model on a subset of a set of substrates used with the global model is that the interpretation of the corresponding process data may be more accurate. This may be because the local model is trained on data associated with a smaller subset of substrates. As a result, the interpretation of the contribution of the data to the prediction is limited to the vicinity of the selected subset of substrates. This may mean that the scope of effects causing yield loss may be smaller than for a large set of substrates. It may therefore be less likely for causes to be averaged out. A second reason for the local model having an improved interpretation of the process data may be that the subset comprises substrates that have been identified and selected based on a quality of prediction by the global model. Having a high quality of prediction may indicate that the global model makes a valid prediction for the substrates in the subset. This may indicate that the substrates of the subset have yield loss properties identifiable by the global model, which may make them susceptible to analysis by the local model. As a result, the trained local model may be able to identify the contributions of the process features for the substrates in the subset.

The local model may be an interpretable model. An interpretable model may be a type of model for which one or more relationships between the model input and the model can be explained intuitively. The local model may provide an indication of how different process features correlate to yield loss data for the substrates. This information obtainable from the trained local model may be used by the method to determine the contribution of a process feature to the performance of the patterning process.

The process data may relate to one or more process features. The process data may comprise measured data of a process feature. For example, a process feature may be overlay, and the process data may comprise overlay data. Alternatively or in addition to measured data, the process data may comprise estimated and/or inferred data. For example, estimated overlay data may be inferred from other measurements made on the substrate. Such inferred/estimated overlay data may also be provided as process data of a substrate.

As described above, the method includes the identification of a subset of the set of substrates that have been provided as input to the global model. The identification step may comprise a selection of one or more substrates in the set for which the quality of prediction by the global model is above a predetermined threshold and/or a predetermined loss metric. The threshold may depend on the type of performance data. The threshold may depend on the expected use case of the pattern of the dies on the substrate. The use case may relate to a use of the analysis data of the feature contributions, and/or may relate to an intended use of the dies themselves. An example threshold may be above 75% correspondence between the prediction and measured data. Example loss metrics include Mean Square Error (MSE) loss, logarithmic (log) loss, cross entropy, classification accuracy, etc. Alternatively, a selection of a subset may be made as a portion of the best quality predictions obtained for the set of substrates. For example, the 10%, 20%, 30%, 40%, or 50% of the substrates in the set with the best prediction results may be selected for the subset. Selecting a substrate in as described above may exclude substrates from the subset which do not obtain a good enough quality of prediction. It may be desirable to exclude such substrates, as the poor prediction quality may indicate that the substrate properties are different from the rest of the substrates and/or the substrates on which the global model was trained. These substrates may be likely to have yield loss properties that differ from the rest of the substrates. As a result, they may be excluded from the subset so that they do not adversely affect the effectiveness of the prediction of root causes.

An advantage of selecting a subset of one or more substrates based on a quality of prediction with the global model is that it may indicate how well the process data and performance data of those substrates matches the global process data and global performance data. If the selection is based on having a high quality of prediction, this may indicate that the global model was able to interpret the process data substantially accurately. This may in turn indicate that the process data of the substrate falls within expected process data values.

Additionally to selection based on a quality of prediction, the identification of a subset 170 of a set of substrates may include a selection of substrates that have a yield within a predetermined range. Whether the yield falls within the predetermined range may be assessed based on a predicted yield or a measured yield. The predetermined range may be set to exclude substrates which have a very high yield. High-yield substrates may provide limited information on determining root causes of yield loss, due to the small amount of failed dies present on the substrate. The predetermined range may also exclude substrates which have a very low yield. The threshold for very low yield may, for example, be set in comparison to other substrates in the set. Low-yield substrates may have alternative and/or additional root causes for yield loss compared to the other substrates in the set, and may be excluded from the analysis of the root causes for the subset.

Figure 5:
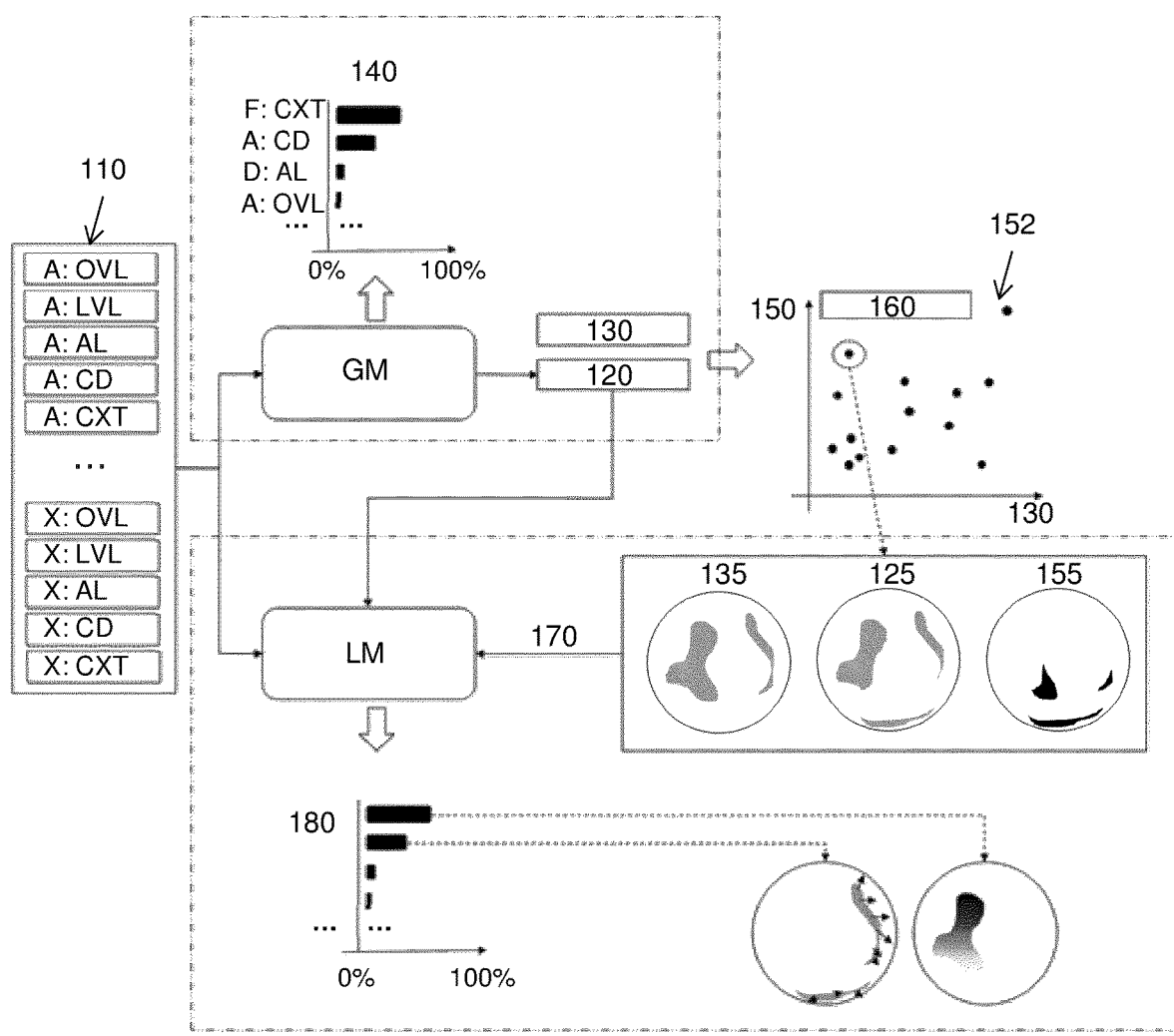
FIG. 5 depicts a schematic representation of a method for determining a contribution of a process feature to the performance of a patterning process.

A method for determining a contribution of a process feature to the performance of a patterning process will now be described in more detail in relation to FIG. 5. FIG. 5 depicts a schematic representation of the different parts of a method described herein. An input 110 is provided to a global model GM. The input 110 may comprise process data relating to a substrate of a set of substrates. The process data may comprise data relating to process features for different layers of the substrate. Process features may comprise any feature of interest from a patterning process. Process features may for example include overlay OVL, levelling LVL, alignment AL, critical dimension CD, and context data CXT. Process data may be provided for one or more process features for each of a plurality of layers, labelled in FIG. 5 by a letter A, . . . X.

Global model GM may receive input 110, and generate an output based on the input. The output may comprise predicted performance data. The performance data may comprise predicted yield data 120 for the substrate. The global model may also provide an estimation of the contribution 140 of a plurality of features to the predicted performance data. The plurality of features may be part of the process data associated with the set of substrates provided to the global model GM. The estimation may be used to provide a ranking of the estimated contribution of the plurality of features to the predicted performance data. The estimation of the contribution 140 in FIG. 5 is an arbitrary example for illustration purposes only. However, as described above, this global model feature contribution 140 may not be suitable for accurately predicting the contribution of a feature to a root cause of yield loss.

In order to determine a quality of the predicted yield 120, actual yield data 130 may be provided for the substrate. Actual yield data 130 may be obtained from measurements on the substrate, for example measurements by a yield probe test. A yield probe test may be a test performed on a final substrate for testing the functionality of the patterns on the substrate. A yield probe may be an electrical test. A yield probe may test each individual die on a substrate. The outcome of a yield probe test may be a classification of a die as "passed" or "failed". Predicted yield 120 and actual yield 130 may be compared in order to determine a quality of prediction 150. For illustration purposes, the prediction quality 150 is plotted against actual yield 130 in a graph 152. Graphical representations of a distribution of the actual yield 135, predicted yield 125, and difference between the actual and predicted yield 155 are depicted for an example substrate from the set. The highlighted areas may represent failed dies on the example substrate. The graphic representations of the yield data may also show a distribution of the location of failed dies, contributing to yield loss, on a substrate.

The method of determining a predicted yield may be repeated for each substrate in a set of substrates 160. The resulting prediction qualities 150 are illustrated in the graph 152 for each substrate in set 160. Based on the prediction qualities for the substrates in the set, a selection of one or more substrates may be identified to form a subset 170. A selection of one or more substrates into subset 170 may additionally be based on a distribution of actual and predicted yield 155. The substrates in subset 170 may be provided to train a local model LM. Once the local model LM has been trained, it may be used to determine a predicted feature importance 180 for the subset 170.

Figure 6:
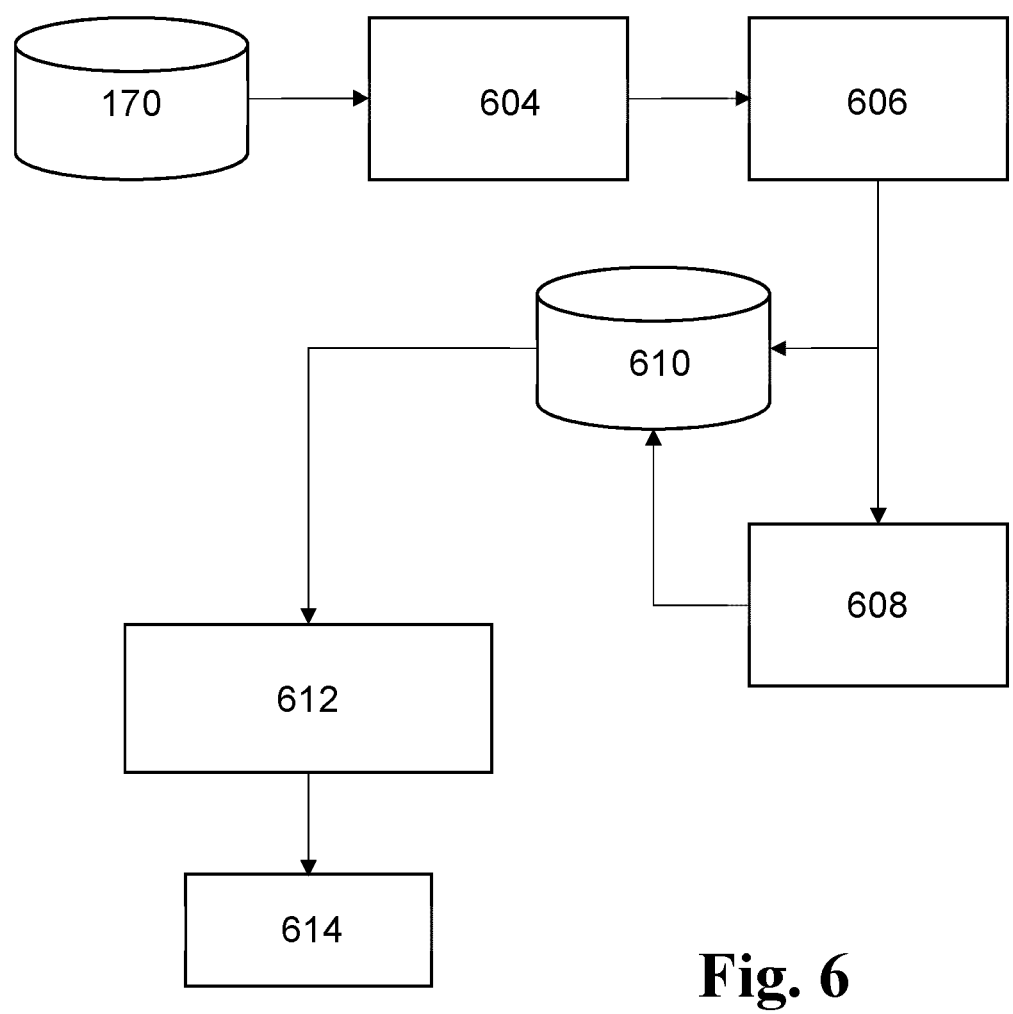
FIG. 6 depicts a flow diagram of training a local model for determining feature contributions to performance data.

As described above, the global model GM may be used to select a subset of substrates based on a quality of predicted performance data 120 output by the global model GM. Once the one or more substrates have been selected, the process data for the subset may be analysed to determine a contribution of process features to the yield loss on the substrates. The analysis may use a local model LM, as shown in FIG. 6. In order to determine a contribution of features to yield loss for a subset of substrates 170, a local model LM may be trained on data related to that subset 170.

The amount of process data available in a subset 170 may not be sufficiently large to train the local model. If a local model is trained on a small amount of data, this may cause overfitting. In order to avoid overfitting, the method may generate data based on the subset process data. The generated data may be used to train the local model LM. Generated data associated with data related to a substrate may be referred to as augmented data or as simulated data. The amount of augmented data that is generated may involve a tradeoff between accuracy of the local model LM, and the processing time needed to generating the data and train the local model. An advantage of increasing the amount of data available for training may be that it can reduce or avoid overfitting of the local model LM.

Augmented process data may be obtained by determining a range 604 around process data of one or more process features, and generating 606 data points within that range. A first example method of generating augmented process data may comprise modelling a parametric distribution for a process feature such as overlay, alignment, critical dimension, etc. Augmented process data may then be obtained by generating a plurality of samples according to the modelled parametric distribution. A second example method of generating augmented process data may comprise determining a range of values for a process feature. The augmented data process may be obtained by generating a plurality of samples within the range of values for the feature. Augmented process data may have the same type of content as the process data of a substrate in the subset. For example, augmented and substrate process data may comprise one or more of the same process features, the same number of layers, the same amount of data points, etc.

In order to use the augmented process data for training, it may be paired with corresponding augmented performance data. The process and performance data may form input-output training pairs for the local model LM. In order to form process-performance data pairs, the augmented process data may be used to generate augmented performance data. In one example implementation, augmented process data may be provided as input to the global model GM. The output produced by the global model GM may be augmented performance data 608 corresponding to the augmented process data input.

The data used to train the local model LM may be referred to as local process data and local performance data 610. Local process data may comprise the augmented process data. Optionally, the local process data may also comprise the process data of the subset 170. Similarly, local performance data may comprise augmented performance data, and optionally performance data of the subset 170. Depending on whether the process data and performance data of the subset are included in the local data or not, training of the local model LM may be based on either both augmented and subset data, or on augmented data alone, respectively. The local model LM may be referred to as a surrogate model, due to it being trained at least in part on augmented data.

The local model LM may be trained on local data 612. The training methods used may be standard training methods for the type of model. The local model LM may be an interpretable model. The local model LM may be an interpretable machine learning model, for example a linear model or a shallow decision tree. The local model LM may provide a feature importance as part of creation of the model, for example a random forest or a gradient boosting tree. The local model LM may provide, once it has been trained, an estimation of the contribution of different process features to the performance data output by the model. As the local model LM is trained on data associated with the subset 170 of identified substrates, the estimation may provide an interpretation relevant to the subset of substrates 170.

In one implementation, the local model LM may be used to determine a contribution of one or more features of the local process data to the local performance data. In order to achieve this, the local model LM may be trained on the local process data and the local performance data. The trained local model LM may be interpretable, so that the trained local model LM may be used to estimate a relation between the one or more features and the local performance data. Based on the interpreted estimated relation obtained from the trained model, the contribution one or more features to the local performance data. As described above, the subset 170 of substrates may have been identified to exhibit similar performance data, using the global model GM. The performance data of the substrates may provide an indication of the performance of the patterning process applied to the substrates. As a result, the estimated contribution may represent a contribution of the one or more features to the performance of the patterning process of the substrates of the subset 170.

Figure 7A:
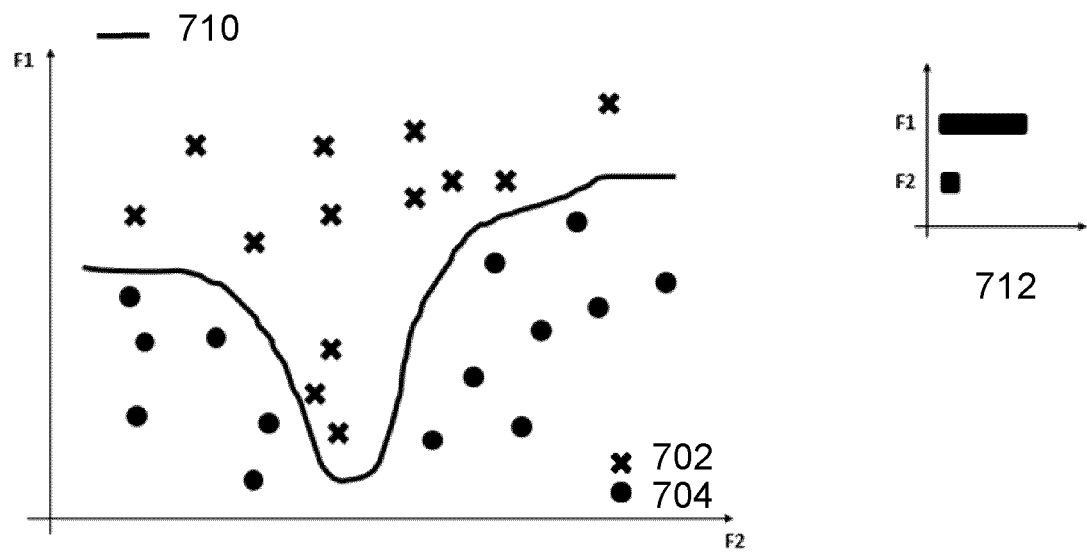
FIGS. 7(a) and 7(b) depict example graphs for determining feature contributions to performance data.
Figure 7B:
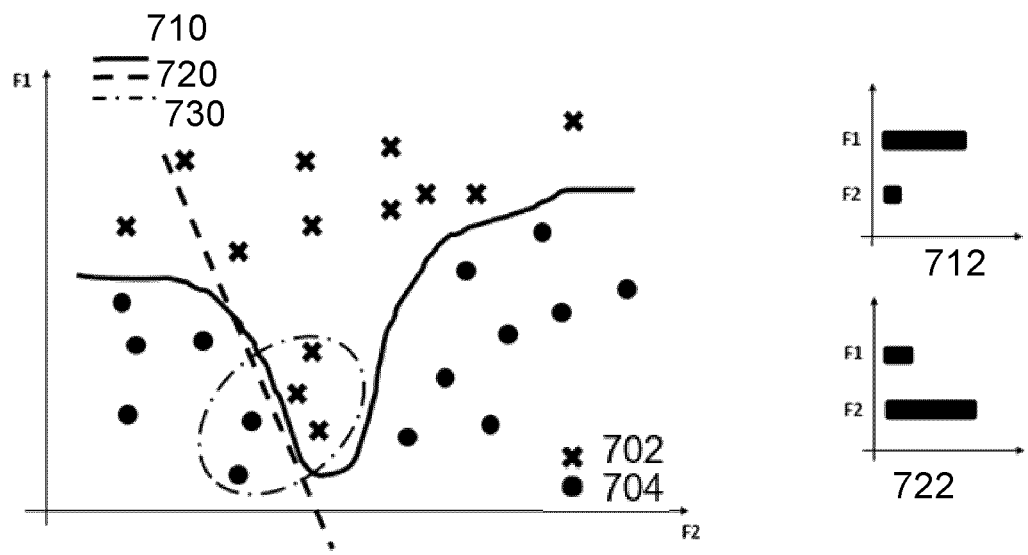

The selection of one or more substrates to form subset 170 may affect the outcome of the estimated contribution of features to the performance of the substrates. FIGS. 7(a) and 7(b) illustrate a possible effect that substrate selection may have on an estimation of feature contribution to yield of a substrate. FIGS. 7(a) and 7(b) depict graphs of a plurality of dies. The dies may all be located on the same substrate, or may alternatively be located on a multiple related substrates, for example substrates in the same lot. The axes of the graph indicate values of two selected process features F1 and F2. The dies are classified in the graph as either a failed die 702, indicated by a cross, or a passed die 704, indicated by a circle. The global model GM provides an estimated pass/fail yield classification for each die on a set of substrates. For each of the plurality of dies, the feature values for F1 and F2 are plotted, and the pass/fail yield classification indicated. The resulting graph can be used to determine a contribution of features F1 and F2 on the die classification.

In FIG. 7(a) a global model GM decision boundary 710 is drawn in the graph, showing the separation between failed and passed dies. Based on the global model GM decision boundary 710, a contribution of features F1 and F2 on the position of the boundary may be estimated 712. In the example graph depicted, the value of feature F1 contributes more to the result of the die performance than the value of feature F2. Based on an evaluation across all of the plurality of dies, feature F1 has a larger contribution to the performance of the die and substrate as a whole.

FIG. 7(b) shows the graph of FIG. 7(a) with an added illustration of selection 730 of dies related to a subset 170 of substrates. A local model is trained based on the substrates 170 of selection 730. The trained local model LM may determine a local model decision boundary 720. Based on the illustrated local model decision boundary 720, feature F2 now contributes more than feature F1 to the pass/fail classification. The local model decision line 720 may be determined by trained local model LM. The estimated feature contribution analysis 722, based on local model LM, differs from the global model estimated feature contributions. A reason for the difference may be understood as the averaging effects of the many dies taken into account in the global model decision boundary 710. These averaging effects are not present in the more targeted estimation on the selected dies 730 of subset 170.

It is understood that the graphs of FIGS. 7(a) and 7(b) are for illustration only. The global model GM and local model LM may make a comparison between more than two features, for example all process features F1 to Fn present in process data. The models GM and LM may determine a contribution of the features based on calculations, without generating a graphic representation.

The methods for determining a contribution of one or more process features to the performance of a patterning process may be used for diagnosis and control of apparatus used in the patterning process. Based on the determined contribution of one or more features to the performance of the process of patterning a substrate, a performance issue may be diagnosed. The contribution of one or more features may be used to diagnose potential root causes of yield loss on a substrate. For example, if a yield loss in a subset of substrates is attributed by the local model LM as being caused by overlay OVL or critical dimension CD of a particular layer, this may indicate an overlay-related or CD-related issue in the corresponding layer. The diagnosis of problems in one or more substrates may indicate a location of the diagnosed problem on a substrate. For example, a yield loss for a first group of elements/dies on a substrate may be diagnosed as being caused by a first problem (e.g. overlay in layer A). A yield loss for a second group of elements/dies on a substrate may be diagnosed as being caused by a second problem (e.g. critical dimension CD in layer B).

Other than diagnosing a performance issue, the method may also be used to control a patterning process. In an example implementation, one or more process settings may be updated and provided to a patterning apparatus, in response to determining a feature's contribution to yield loss. For example, upon determining overlay makes a large contribution to yield loss, the overlay data may be examined further. Updates of process settings may be determined to improve the overlay properties of subsequent patterns formed on substrates, which may in turn reduce the contribution of overlay yo yield loss. In one example implementation, the local model LM may be used for determining feature values resulting in an increase in estimated yield loss.

Further embodiments of the invention are disclosed in the list of numbered clauses below:

1. A method of determining a contribution of a process feature to the performance of a process of patterning substrates, the method comprising:
   obtaining a first model trained on first process data and first performance data;
   identifying one or more substrates based on a quality of prediction of the first model when applied to process data associated with the one or more substrates;
   training a second model on second process data and second performance data associated with the identified one or more substrates; and
   using the second model to determine the contribution of the process feature of the second process data to the second performance data associated with the one or more substrates.
2. A method according to clause 1, wherein identifying one or more substrates comprises:
   providing process data associated with a plurality of substrates as input to the first model; and
   obtaining predicted performance data as an output of the first model.
3. A method according to clause 2, further comprising: obtaining measured performance data for the plurality of substrates.
4. A method according to clause 2 or clause 3, wherein identifying one or more substrates further comprises comparing the predicted performance data to the measured performance data to determine the quality of prediction.
5. A method according to any of clauses 2 to 4, wherein the predicted performance data comprises predicted yield data.
6. A method according to any of the preceding clauses, wherein the first model comprises a neural network.
7. A method according to any of clauses 2 to 6, wherein the output of the first model further comprises an estimate of the contribution of a plurality of process features of the process data associated with the plurality of substrates to the predicted performance data.
8. A method according to clause 7, wherein the output of the first model comprises a ranking of the estimated contribution of the plurality of process features to the predicted performance data.
9. A method according to any of clauses 7 to 8, wherein the plurality of process features include one or more of overlay, alignment, levelling, critical dimension, thickness, and context data.
10. A method according to any of the preceding clauses, wherein the process data comprises data in relation to a plurality of layers of a substrate.
11. A method according to any of the preceding clauses, further comprising:
    generating augmented process data based on the one or more identified substrates.
12. A method according to clause 11, wherein the second process data comprises the augmented process data and the process data of the one or more identified substrates.
13. A method according to any of clauses 11 to 12, wherein generating augmented process data comprises:
    modelling a parametric distribution for a process feature; and
    generating a plurality of samples according to the modelled parametric distribution, wherein the augmented process data comprises the plurality of samples.
14. A method according to any of clauses 11 to 13, wherein generating augmented process data comprises:
    determining a range of values for a process feature; and
    generating a plurality of samples within the range of values for the process feature, wherein the augmented process data comprises the plurality of samples.
15. A method according to any of clauses 11 to 14, further comprising:
    providing the augmented process data as input to the first model, and obtaining augmented predicted performance data as an output of the first model.
16. A method according to clause 15, wherein the second performance data comprises the augmented predicted performance data and the predicted performance data for the one or more substrates.
17. A method according to any of the preceding clauses, wherein the second model is an interpretable model.
18. A method according to clause 17, wherein the interpretable model comprises one or more of a linear model, a shallow decision tree, a random forest, or a gradient boosting tree.
19. A method according to any of the preceding clauses, wherein using the second model to determine a contribution of a process feature of the second process data to the second performance data associated with the identified one or more substrates comprises:
    training the second model on the second process data and the second performance data;
    using the second model to estimate a relation between a process feature and second performance data; and
    determining the contribution of a process feature based on the estimated relation.
20. A method according to any of the preceding clauses, wherein a substrate is identified if the quality of prediction is above a predetermined threshold.
21. A method according to any of the preceding clauses, wherein a substrate is identified if the quality of prediction is above a predetermined loss metric.
22. A method according to any of the preceding clauses, wherein the first model is a global model representing a set of substrates; and wherein the second model is a local model representing a selected subset of the set of substrates.

23. A method according to any of the preceding clauses, further comprising:
diagnosing a performance issue of an apparatus for performing the process of patterning substrates based on the determined contribution of the process feature.

24. A method according to any of the preceding clauses, further comprising:
updating one or more process settings based on the determined contribution of the process feature; and
providing the updated one or more process settings to an apparatus performing the process of patterning substrates.

25. A computer program comprising instructions which, when executed on at least one processor, cause the at least one processor to carry out a method according to any of clauses 1 to 24.

26. A processor-readable medium comprising instructions which, when executed by a processor, cause the processor to perform a method in accordance with any of clauses 1 to 24.

27. An apparatus for determining a contribution of a process feature to the performance of a process of patterning substrates, the apparatus comprising one or more processors configured to execute compute program code to undertake the method as set out in any of clauses 1 to 24.

28. A metrology apparatus comprising an apparatus according to clause 27.

29. An inspection apparatus comprising an apparatus according to clause 27.

30. A lithographic apparatus comprising an apparatus according to clause 27.

The methods described herein may be implemented as instructions in a computer program. The computer program may be executed on an apparatus, for example a metrology tool MT, an inspection apparatus, or a lithographic apparatus LA.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus.

Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method comprising:
obtaining a first model trained on first process data and first performance data;
identifying one or more substrates based on a quality of prediction of the first model when applied to process data associated with the one or more substrates;
training, by a hardware computer system, a second model on second process data and second performance data associated with a process of patterning substrates and associated with the identified one or more substrates; and
using the second model to determine a contribution of a process feature of the second process data to the second performance data associated with the one or more substrates.

2. The method according to claim 1, wherein the identifying one or more substrates comprises:
providing process data associated with a plurality of substrates as input to the first model; and
obtaining predicted performance data as an output of the first model.

3. The method according to claim 2, further comprising obtaining measured performance data for the plurality of substrates.

4. The method according to claim 3, wherein the identifying one or more substrates further comprises comparing the predicted performance data to the measured performance data to determine the quality of prediction.

5. The method according to claim 2, wherein the predicted performance data comprises predicted yield data.

6. The method according to claim 2, wherein the output of the first model further comprises an estimate of a contribution of a plurality of process features of the process data associated with the plurality of substrates to the predicted performance data.

7. The method according to claim 6, wherein the output of the first model comprises a ranking of the estimated contribution of the plurality of process features to the predicted performance data.

8. The method according to claim 6, wherein the plurality of process features include one or more selected from: overlay, alignment, levelling, critical dimension, thickness, and/or context data.

9. The method according to claim 1, wherein the first model comprises a neural network.

10. The method according to claim 1, further comprising generating augmented process data based on the one or more identified substrates.

11. The method according to claim 10, wherein the second process data comprises the augmented process data and the process data of the one or more identified substrates.

12. The method according to claim 10, wherein the generating augmented process data comprises:
modelling a parametric distribution for a process feature; and
generating a plurality of samples according to the modelled parametric distribution, wherein the augmented process data comprises the plurality of samples.

13. The method according to claim 1, wherein the second model is an interpretable model comprising one or more selected from: of a linear model, a shallow decision tree, a random forest, or a gradient boosting tree.

14. The method according to claim 1, wherein the using the second model to determine a contribution of a process feature of the second process data to the second performance data associated with the identified one or more substrates comprises:
training the second model on the second process data and the second performance data;
using the second model to estimate a relation between a process feature and second performance data; and
determining the contribution of a process feature based on the estimated relation.

15. An apparatus for determining a contribution of a process feature to the performance of a process of patterning substrates, the apparatus comprising one or more processors configured to execute computer program code to undertake the method as set out in claim 1.

16. A non-transitory processor-readable medium comprising instructions therein, which instructions, when executed by a processor system, are configured to cause the processor system to at least:
obtain a first model trained on first process data and first performance data;
identify one or more substrates based on a quality of prediction of the first model when applied to process data associated with the one or more substrates;
train a second model on second process data and second performance data associated with a process of patterning substrates and associated with the identified one or more substrates; and
use the second model to determine a contribution of a process feature of the second process data to the second performance data associated with the one or more substrates.

17. The processor-readable medium of claim 16, wherein the instructions configured to cause the processor system to identify one or more substrates are further configured to cause the processor system to:
provide process data associated with a plurality of substrates as input to the first model; and
obtain predicted performance data as an output of the first model.

18. The processor-readable medium of claim 17, wherein the instructions configured to cause the processor system to identify one or more substrates are further configured to cause the processor system to compare the predicted performance data to measured performance data for the plurality of substrates to determine the quality of prediction.

19. The processor-readable medium of claim 17, wherein the predicted performance data comprises predicted yield data.

20. The processor-readable medium of claim 16, wherein the first model comprises a neural network.

* * * * *